United States Patent [19]

Clayton et al.

[11] Patent Number: 5,364,045
[45] Date of Patent: Nov. 15, 1994

[54] METHOD AND APPARATUS FOR DISPENSING ELECTRONIC COMPONENTS

[75] Inventors: Everett A. Clayton, Wilton Manors; Kiron Gore, Coral Springs, both of Fla.

[73] Assignee: Motorola, Inc., Schaumburg, Ill.

[21] Appl. No.: 71,826

[22] Filed: Jun. 7, 1993

[51] Int. Cl.⁵ ............................................ B65H 75/16
[52] U.S. Cl. ............................ 242/588.6; 206/213.1; 206/409; 221/70; 242/908
[58] Field of Search ............... 242/54 R, 55, 55.53, 242/71.1, 197; 206/213.1, 409; 221/70-74, 154, 278; 53/432, 433, 86, 118, 119

[56] References Cited

U.S. PATENT DOCUMENTS

| | | | |
|---|---|---|---|
| 1,848,859 | 3/1932 | Wishart | 242/55.53 |
| 3,603,528 | 9/1971 | Kingsley | 242/197 |
| 3,798,657 | 3/1974 | Alden | 242/197 X |
| 3,920,394 | 11/1975 | Marrapodi | 206/213.1 |
| 4,513,862 | 4/1985 | Mallow | 206/213.1 |
| 5,014,929 | 5/1991 | Kato et al. | 242/197 X |
| 5,038,934 | 8/1991 | Higashiyama | 206/409 X |
| 5,046,674 | 9/1991 | Kolschbach et al. | 242/54 R |
| 5,123,608 | 6/1992 | LeCompte | 242/54 R |
| 5,195,689 | 3/1993 | Beer et al. | 242/55.53 |

OTHER PUBLICATIONS

Terra Universal Inc., Desiccators, article "Tape and Reel ® Desiccator" pp. 76 and 77, undated.

Primary Examiner—John M. Jillions
Attorney, Agent, or Firm—Andrew S. Fuller

[57] ABSTRACT

A method for dispensing substantially moisture free electronic components (145) from a canister (150) includes filling the canister (150) with pressurized gas, dispensing components (145) mounted on a component carrier (140) through an opening (154) within the canister (150), conforming the opening (154) to the components (145) and to the component carrier (140) as the components (145) are dispensed, and maintaining sufficient gas pressure within the canister (150) to prevent air from entering into the canister (150). The canister (150) has an inlet (158) for receiving a gas and a seal (156) disposed about the opening (154) to reduce the amount of gas loss through the opening (154) when the components (145) are dispensed.

9 Claims, 2 Drawing Sheets

METHOD AND APPARATUS FOR DISPENSING ELECTRONIC COMPONENTS

TECHNICAL FIELD

This invention relates in general to a method and apparatus for dispensing electronic components, and in particular, to a method and apparatus for dispensing moisture free electronic components for use in an assembly operation.

BACKGROUND

Electronic components used in the manufacture of electronic devices must often be stored within a factory environment for an extended period of time before their use. Some components are susceptible to moisture absorption which can adversely impact the utility of these components. Rapid evaporation of the absorbed moisture during assembly operations involving intense heat, such as a solder reflow operation, may cause delamination of the various layers of material which make up the component. The period of exposure to moisture which a component can sustain while still maintaining its utility is called the shelf life of the component. A typical shelf life of a component exposed to a moisture content of 85 percent humidity at 85 degrees Fahrenheit is approximately 96 hours. Consequently, these components are usually stored in a moisture controlled environment, such as a dry box, or the like. When the availability of the components is required for assembly operations within the factory, the components are often removed from the moisture controlled environment and placed in a convenient location for an assembly operation.

A typical assembly process may include automatic part placement machines operating at a high part placement rate. Many of these machines use a parts feeding system in which the components are mounted on a reel to facilitate automatic placement. The reeled components are removed from storage in a moisture controlled environment and installed into the parts feeding system when required for assembly. Once placed in the feeder system, the components are exposed to moisture present in the factory environment. Depending on the frequency of use and the number of components on a reel, the components may exceed their shelf life before being used for assembly. Hence, the components may become unusable until the moisture is removed, if this is possible.

Attempts to solve this problem include placing the part placement machine in an enclosure for which the moisture content is controlled, and enclosing the entire parts feeding system in a moisture controlled environment. Neither of these solutions has produced satisfactory results. One major factor is the cost involved in maintaining the moisture content control while accommodating the frequent environment breaches which occur because of parts swapping and feeder system maintenance. Another factor is that the bulk of these enclosures may interfere with normal manufacturing operations.

There may be a significant adverse impact on manufacturing efficiency and cost because of the problems associated with the moisture content of components. A solution which reduces or eliminates moisture absorption by components, especially with respect to a reeled components parts feeding system, is needed.

SUMMARY OF THE INVENTION

Briefly, in accordance with the invention, a method and an apparatus for dispensing components is described. The method allows dispensing substantially moisture free electronic components from a canister for use in a parts feeding system, where the components are mounted on a component carrier, and includes the following steps: filling the canister with pressurized gas; dispensing the components through an opening within the canister; conforming the opening to the components and to the component carrier as the components are being dispensed; and maintaining sufficient gas pressure within the canister to prevent air from entering into the canister. The apparatus includes the canister which has an inlet for receiving a gas and an opening for dispensing components, a component carrier within the canister; an inert gas within the canister; and a seal disposed about the opening, to reduce the amount of gas loss through the opening when the components are dispensed.

DETAILED DESCRIPTION OF THE PREFERRED EMBODIMENT

Figure 1:
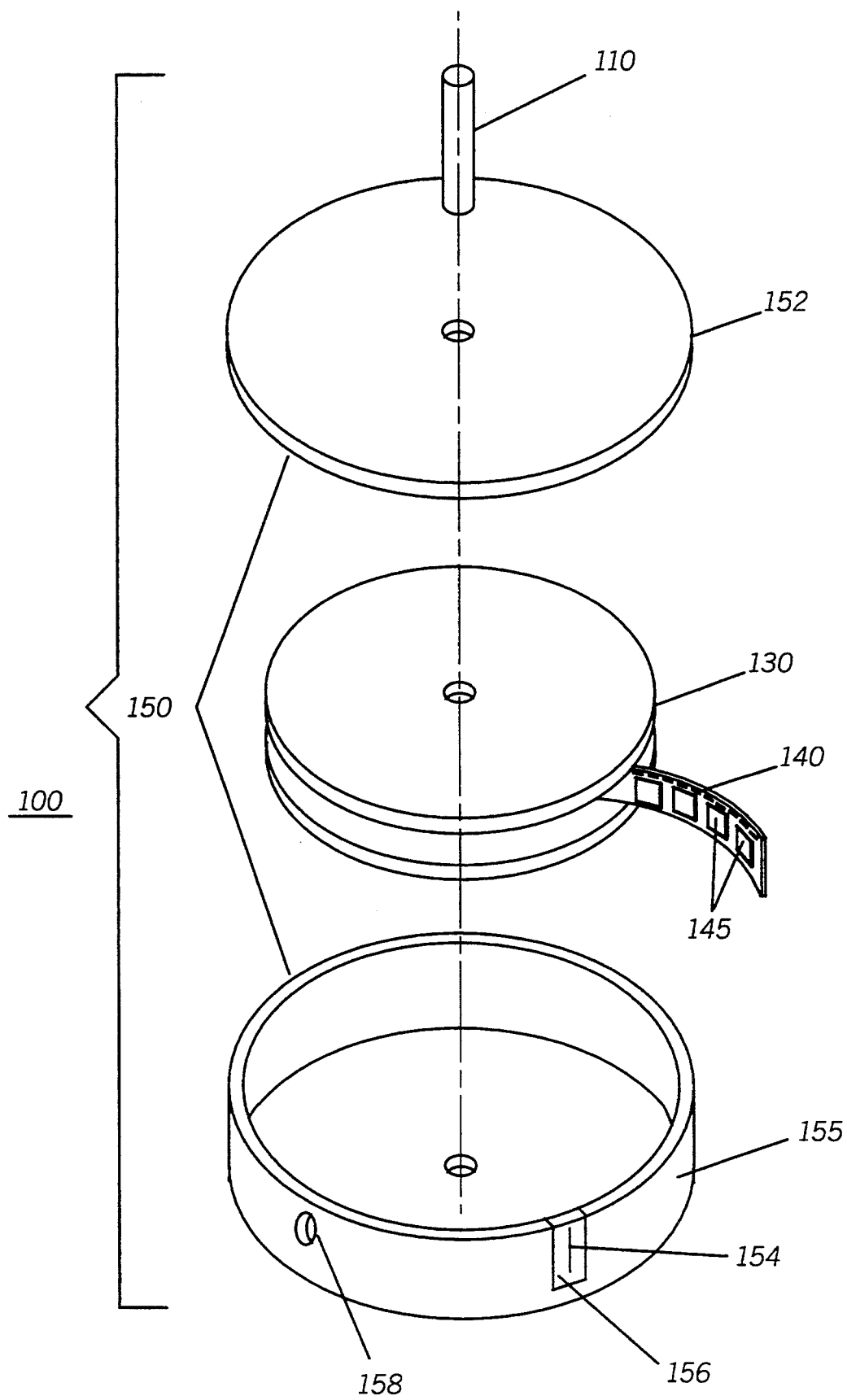
FIG. 1 is an exploded perspective view of a canister assembly made in accordance with the present invention.

FIG. 1 shows a canister assembly 100 in accordance with the present invention. Electronic components 145 are mounted on a component carrier which is situated within a canister 150. Preferably, the component carrier is a tape 140 which is wound around a component reel 130. The canister 150 is formed to accommodate the component reel 130 which is substantially circular. The canister 150 has a main container area 155 in which the component reel 130 is mounted, and a cover 152 to secure the component reel 130 within the canister 150. The canister 150 has an opening 154 through which the components 145 are dispensed during an assembly operation. A centrally located axle 110 extends through the canister cover 152, the center of the component reel 130, and the main container area 155. The component reel 130 is rotatable about the axle 110, and the tape 140 containing the components 145 exits the canister 150 through the opening 154 as the component reel 130 is rotated.

Figure 2:
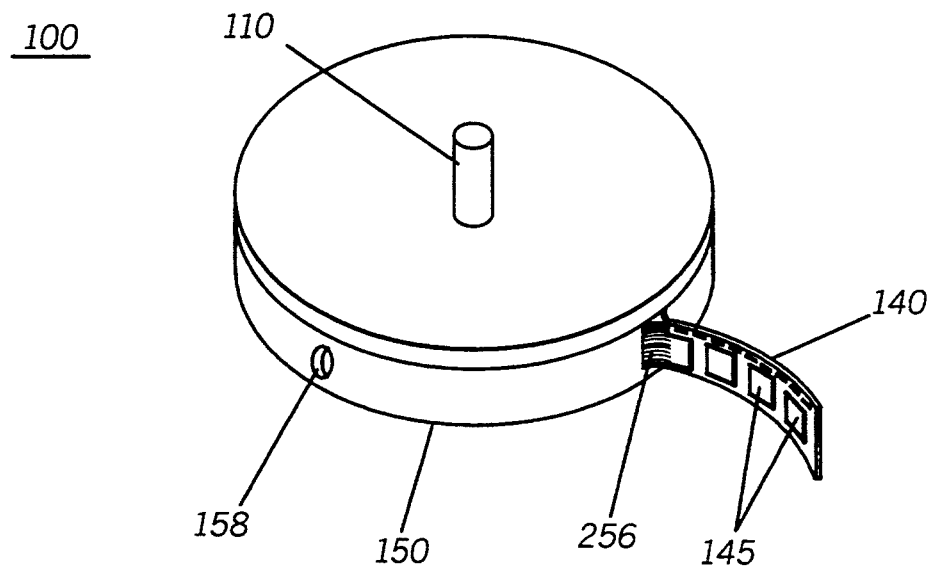
FIG. 2 is a perspective view of a canister using compacted bristle as a sealing means in accordance with the present invention.
Figure 3:
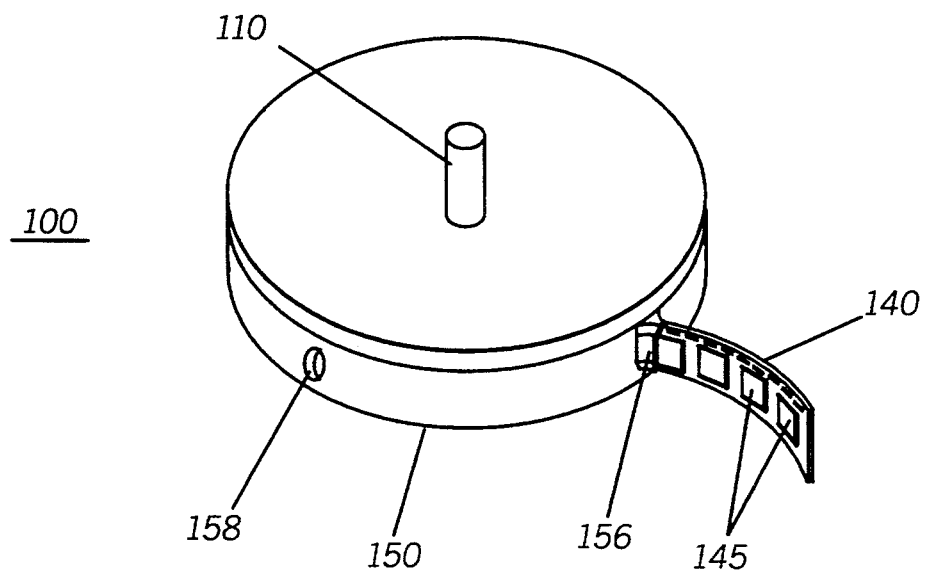
FIG. 3 is a perspective view of a cananister using an elastic membrane as a sealing means in accordance with the present invention.

The canister 150 is used as a moisture controlled environment to protect the enclosed components 145 from moisture damage. The canister 150 has an inlet 158 for introducing a gas, such as nitrogen, or any other suitable gas, such as an inert gas, into the canister 150. Pressurized nitrogen is forced into the canister 150 through the inlet 158 thereby filling the canister 150 with nitrogen and displacing the air along with any moisture which may be in the canister 150. Sufficient nitrogen pressure is maintained within the canister 150 to prevent air from entering the canister 150. To minimize the loss of nitrogen as components 145 are being dispensed, the canister 150 includes a sealing means, such as an elastic compliant membrane or barrier 156, disposed about the opening 154, which can conform to the irregular surface of the components 145 and the component tape 140. The membrane 156 abuts the components 145 and the component tape 140 as they exit through the opening 154 (see FIG. 3), thereby forming a snug fit around the components 145 and the component tape 140 to inhibit the loss of nitrogen from the canister 150. Among other alternatives, compacted bristles 256 (see FIG. 2) may be used instead of the elastic membrane 156 as a sealing means. Preferably, the canister 150 is constructed to minimize or eliminate the loss of nitrogen. However, since some nitrogen loss is probable, additional nitrogen is constantly forced through the inlet 158 to replace that which escapes.

Thus, the components 145 can be maintained in a moisture controlled environment until they are used in assembly operations. Ordinarily, the components 145 will be supplied from the component supplier in a moisture controlled enclosure. Preferably, the canister 150 is used by the component supplier to package the component reel 130 for delivery to a factory. Of course, all the canister 150 openings would have to be sealed, or the entire canister 150 enclosed, to prevent the components 145 from being exposed to air. Although it is possible to put multiple reels in a single canister 150, preferably, the canister 150 is formed to fit individual reels, thus making the canister 150 more easily manipulable. When the components 145 are needed for assembly operations, the canister 150 is installed in a parts feeding system (not shown) and attached to a nitrogen supply (not shown). Alternatively, if the component reel 130 is not supplied in a canister 150, the component reel 130 can be stored in a separate moisture controlled environment and then transferred into the canister 150 when needed for assembly.

An assembly operation using the canister 150 in accordance with the present invention has several benefits. An improvement in manufacturing efficiency can be realized because the canisters 150 may be used without substantially interfering with normal manufacturing operations. Moreover, the present invention accommodates parts swapping and parts feeding system maintenance without sustaining breaches to the moisture controlled environment. Additionally, the cost of protecting the components 145 from moisture damage can be significantly lower than the cost associated with existing systems because of the relatively small amount of nitrogen needed to maintain moisture control in the canister 150. Thus, the use of the present invention can increase manufacturing efficiency and reduce manufacturing cost.

What is claimed is:

1. A method for dispensing substantially moisture free electronic components from a canister for use in a parts feeding system, wherein the components are mounted on a component carrier, comprising the steps of:
   filling the canister with pressurized gas;
   dispensing the components through an opening within the canister;
   conforming said opening to the components and to the component carrier as the components are being dispensed, thereby reducing the amount of gas loss through said opening; and
   maintaining sufficient gas pressure within the canister to prevent air from entering into the canister.

2. A method for dispensing substantially moisture free electronic components from a canister for use in a parts feeding system, wherein the components are mounted on a component carrier as defined in claim 1, wherein said conforming step comprises passing the components through an elastic compliant membrane which conforms to the irregular shapes of the components and the component carrier.

3. A method for dispensing substantially moisture free electronic components from a canister for use in a parts feeding system, wherein the components are mounted on a component carrier as defined in claim 1, wherein said conforming step comprises passing the components through compacted bristles which conform to the irregular shapes of the components and the component carrier.

4. An apparatus for maintaining a substantially moisture free environment for electronic components, comprising:
   a canister having an inlet for receiving a gas and an opening for dispensing components;
   a component carrier having components thereon situated within said canister;
   an inert gas, forcibly maintained within said canister;
   sealing means, disposed about said opening, for reducing the amount of gas loss through said opening when the components are dispensed.

5. An apparatus for maintaining a substantially moisture free environment for electronic components as defined in claim 4, wherein said canister is formed to fit a single component reel.

6. An apparatus for maintaining a substantially moisture free environment for electronic components as defined in claim 4, wherein:
   said component carrier is a tape wound around a component reel; and
   said canister has a central axle about which said component reel is rotatable.

7. An apparatus for maintaining a substantially moisture free environment for electronic components as defined in claim 4, wherein said sealing means comprises an elastic membrane which conforms to the components and to said component carrier as the components are being dispensed, thereby reducing the amount of gas loss through said opening.

8. An apparatus for maintaining a substantially moisture free environment for electronic components as defined in claim 4, wherein said sealing means comprises bristles which conforms to the components and to said component carrier as the components are being dispensed, thereby reducing the amount of gas loss through said opening.

9. An apparatus for maintaining a substantially moisture free environment for a component reel having electronic components on a tape mounted thereon, comprising:
   a canister having an inlet for receiving a gas and an opening for dispensing components, said canister having a central axle about which the component reel is rotatable;
   an inert gas, forcibly maintained within said canister; and
   sealing means for reducing the amount of gas loss through said opening when the components are dispensed, said sealing means disposed about said opening and conforming to the components and to the tape as the components are being dispensed.

* * * * *